(12) United States Patent
Raukas et al.

(10) Patent No.: US 9,133,392 B2
(45) Date of Patent: Sep. 15, 2015

(54) GARNET MATERIAL, METHOD FOR ITS MANUFACTURING AND RADIATION-EMITTING COMPONENT COMPRISING THE GARNET MATERIAL

(75) Inventors: Madis Raukas, Charlestown, MA (US); Karl Krister Bergenek, Regensburg (DE); George C. Wei, Weston, MA (US); Nathan M. Zink, Salem, MA (US); Stefan Lange, Augsburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 491 days.

(21) Appl. No.: 12/841,989

(22) Filed: Jul. 22, 2010

(65) Prior Publication Data
US 2012/0018673 A1    Jan. 26, 2012

(51) Int. Cl.
| | | |
|---|---|---|
| *C09K 11/77* | (2006.01) | |
| *H01J 1/62* | (2006.01) | |
| *H01J 63/04* | (2006.01) | |
| *C04B 35/44* | (2006.01) | |

(52) U.S. Cl.
CPC ............. *C09K 11/7774* (2013.01); *C04B 35/44* (2013.01); *C04B 2235/3215* (2013.01); *C04B 2235/3217* (2013.01); *C04B 2235/3222* (2013.01); *C04B 2235/3224* (2013.01); *C04B 2235/3229* (2013.01); *C04B 2235/5436* (2013.01); *C04B 2235/6582* (2013.01); *C04B 2235/764* (2013.01); *C04B 2235/77* (2013.01); *C04B 2235/9646* (2013.01)

(58) Field of Classification Search
CPC .................. C09K 11/7774; C09K 11/7706
USPC .................... 252/301.4 R; 313/503
See application file for complete search history.

(56) References Cited

U.S. PATENT DOCUMENTS

| | | | |
|---|---|---|---|
| 6,669,866 B1 | 12/2003 | Kummer et al. | |
| 6,844,285 B1 | 1/2005 | Wei | |
| 7,122,951 B2 * | 10/2006 | Heider et al. | 313/487 |
| 7,671,529 B2 * | 3/2010 | Mueller et al. | 313/503 |

(Continued)

FOREIGN PATENT DOCUMENTS

| | | |
|---|---|---|
| CN | 101503620 | 8/2009 |
| EP | 0 926 106 | 6/1999 |

(Continued)

OTHER PUBLICATIONS

Kang. YAG:Ce phosphor particles prepared by ultrasonic spray pyrolysis. Materials Research Bulletin vol. 35, Issue 5, Mar. 15, 2000, pp. 789-798.*

(Continued)

*Primary Examiner* — Matthew E Hoban
(74) *Attorney, Agent, or Firm* — Cozen O'Connor

(57) ABSTRACT

A material, comprising a garnet having the composition represented by the formula $A_{3-x}B_5O_{12}:D_x$ and a barium-containing oxide. In the garnet $A_{3-x}B_5O_{12}:D_x$, A is selected from lutetium, yttrium, gadolinium, terbium, scandium, another rare earth metal or mixtures thereof. B is selected from aluminum, scandium, gallium, indium, boron or mixtures thereof. D is at least one dopant selected from chromium, manganese and rare earth metals, particularly cerium, praseodymium or gadolinium. The dopant is present with x is $0 \leq x \leq 2$.

23 Claims, 5 Drawing Sheets

(56) References Cited

U.S. PATENT DOCUMENTS

| | | |
|---|---|---|
| 2004/0173807 A1 | 9/2004 | Tian et al. |
| 2007/0278451 A1 | 12/2007 | Naum |
| 2010/0276717 A1* | 11/2010 | Boerkekamp et al. .......... 257/98 |

FOREIGN PATENT DOCUMENTS

| | | |
|---|---|---|
| EP | 2 088 182 A2 | 8/2009 |
| JP | 2008-174690 | 7/2008 |
| JP | 2011-513898 | 4/2011 |
| WO | WO 2009/105581 | 8/2009 |

OTHER PUBLICATIONS

Babin, V. et al.: "Influence of Lead-Related Centers on Luminescence of $Ce^{3+}$ and $Pr^{3+}$ Centers in Single Crystalline Films of Aluminum Perovskites and Garnets," Radiation Measurements, vol. 45, 2010, Elsevier Ltd., pp. 415-418.

Babin, V. et al.: "Luminescence of Dimmer Lead Centers in Aluminum Perovskites and Garnets," Phys. Status Solidi B 246, Nov. 6, 2009, pp. 1318-1326.

Kucera, M. et al.: "Ce-doped YAG and LuAG Epitaxial Films for Scintillation Detectors," IEEE Transactions on Nuclear Science, vol. 55, No. 3, Jun. 2008, pp. 1201-1205.

Kucera, M. et al.: "Defects in Ce-doped LuAG and YAG Scintillation Layers Grown by Liquid Phase Epitaxy," Radiation Measurements, vol. 45, 2010, Elsevier Ltd., pp. 449-452.

Prusa, P. et al.: "Scintillation Properties of LuAG:Ce Single Crystalline Films Grown by LPE Method," Optical Materials, vol. 32, 2010, Elsevier B.V., pp. 1360-1363.

Prusa, P. et al.: "The α-particle Excited Scintillation Response of the Liquid Phase Epitaxy Grown LuAG:Ce Thin Films," Applied Physics Letters 92, 2008, 041903.

Babin, V. et al.: "Antisite detects study in udoped and $Ce^{3+}$-doped LuScAG and LuYAG crystals: influence on scintillation efficiency", Hasylab Activity Report 2005, Part 1, pp. 261-262.

De With, G. et al.: "Translucent $Y_3Al_5O_{12}$ ceramics", Mat. Res. Bulletin, vol. 19, 1984, pp. 1669-1674.

Holloway, Jr., W.W. et al.: "On the fluorescence of cerium-activated garnet crystals", Physics Letters A, vol. 25, Issue 8, Oct. 1967, pp. 614-615.

Ikesue, A. et al.: "Microstructure and Optical Properties of Hot Isostatically Pressed Nd:YAG Ceramics", Journal of the American Ceramic Society, vol. 79, No. 7, 1966, pp. 1927-1933.

Li, H.-L et al.: "Fabrication of Transparent Cerium-Doped Lutetium aluminum Garnet Ceramics by Co-precipitation Routes", Journal of the American Ceramic Society, vol. 89, 2006, pp. 2356-2358.

Li, H.-L et al.: "Cerium-Doped Lutetium Aluminum Garnet Phosphors and Optically Transparent Ceramics Prepared from Powder Precursors by a Urea Homogeneous Precipitation Method", Japanese Journal of Applied Physics, vol. 47, No. 3, 2008, pp. 1657-1661.

Li, H.-L et al.: "Fabrication of Transparent Cerium-Doped Lutetium aluminum Garnet (LuAG:Ce) Ceramics by a Solid State Reaction Method", Journal of the American Ceramics Society, vol. 88, 2005, pp. 3226-3228.

Liao, Y.-k. et al.: "Preparation, spectroscopic properties and enhanced luminescence of $Tb^{3+}$-doped LuAG phosphors and transparent ceramics by introduction of $Sc^{3+}$", J. Mater, Sci., vol. 42, 2007, pp. 5406-5410.

Mahalingam, V. et al.: "Bright White Upconversion Emission from Tm/Yb/Er-Doped LuGaO Nanocystals", The Journal of Physical Chemistry C., vol. 112, 2008, pp, 17745-17749.

Nikl, M. et al.: "Optimisation of Scintillation Performance Pr-doped Garnet Single Crystals", HASYLAB Activity Report 2007, Part 1, pp. 725-726.

Nikl, M. et al.: "Scintillation characteristics of $Lu_3Al_5O_{12}$:Ce optical ceramics", Journal of Applied Physics, 2007, vol. 101, 0333515.

Schuh, L. H.: "Microstructure and Defect Chemistry of Yttrium Aluminium Garnet Ceramics", Ph.D. Thesis, Technical University of Eindhoven, 1989.

Wang, Z. et al.: "Synthesis and luminescent properties of nano-scale LuAG:RE3+ (Ce, Eu) phoshors prepared by co-precipitation method", Journal of Luminescence, 122-123, (2007), pp. 437-439.

Wei, G. C. et al.: "Characterization of Second Phases in Translucent Alumina by Analytical Transmission Electron Microscopy", Ceramic Microstructure: Control at the Atomic Level, Plenum Press, New York, 1998, pp. 311-322.

Winkler, H. et al.: "LED Applications of Conversion Phosphors", Phosphor Global Summit, Miami, FL, Mar. 2009.

Zhao, J. et al.: "Synthesis and luminescent properties of Pr-doped $Lu_3Al_5O_{12}$ translucent ceramic", Journal of Rare Earths, vol. 27, No. 3, 2009, pp. 376-380.

Zharikov, E. V.: "Crystals of Scanium Garnets for Solid State Lasers", SIE Digital Library, vol. 1839, Solid State Lasers and New Laser Materials, 1991, pp. 46-68.

\* cited by examiner

← 30 μm →

GARNET MATERIAL, METHOD FOR ITS MANUFACTURING AND RADIATION-EMITTING COMPONENT COMPRISING THE GARNET MATERIAL

FIELD OF THE INVENTION

The invention relates to a garnet phosphor material for excitation with light having short wavelengths and conversion into light with longer wavelengths, an optoelectronic component comprising this material and a method for manufacturing this material.

BACKGROUND OF THE INVENTION

Activated garnets of rare earth metals and group thirteen elements are used as phosphors in optoelectronic components, for example in light-emitting diodes (LEDs). The elements of group thirteen elements are used depending on the wavelength that is required. Rare earth metal aluminum garnets such as yttrium aluminum garnet (YAG) which are activated with another rare earth element, e.g. cerium or praseodymium or a transition metal such as chromium or manganese are prominent phosphors Lutetium aluminum garnet (LuAG) doped with cerium, LuAG:Ce or $(Lu,Ce)_3Al_5O_{12}$, was reported as a stable green phosphor.

For applications in optoelectronic components, dense and highly transparent ceramic material is desired. Therefore, there is need for phosphors, e.g. garnets, with improved properties.

SUMMARY OF THE INVENTION

It is, therefore, an object of the invention to provide an improved garnet material that is suitable for optoelectronic purposes, e.g. as a phosphor in LEDs.

Further objects are providing optoelectronic components with better efficiency and the synthesis of garnet materials from readily available precursors.

A material is disclosed, the material comprising a garnet having the composition represented by the formula $A_{3-x}B_5O_{12}:D_x$ (or $(A,D)_3B_5O_{12}$) and a barium-containing oxide or consisting of said garnet and barium-containing oxide. In the garnet $A_{3-x}B_5O_{12}:D_x$, A is selected from lutetium, yttrium, gadolinium, terbium, scandium, another rare earth metal or mixtures thereof. For example, gadolinium and/or terbium may partly replace yttrium or lutetium in the material. B is selected from aluminum, scandium, gallium, indium, boron or mixtures thereof. D is a dopant selected from cerium, praseodymium, gadolinium, another rare earth metal, a transition metal such as chromium and manganese or a combination thereof. The dopant is present with x is $0 \leq x \leq 2$. In particular, x is often $0 < x \leq 0.2$. In the following, this material is also called the "garnet material". Usually, the garnet material is transparent and polycrystalline.

A dopant is a species that is added to a crystal lattice in low concentrations in order to alter the optical and/or electrical properties of the material. In luminescent materials, e.g. in a phosphor, the dopant can be an activator, that is, an emission center which is emitting light generated or converted by the material. The wavelength of the emitted light is dependent on the element used as dopant.

In an embodiment, in the garnet contained in the garnet material, A is selected from lutetium, yttrium, gadolinium, terbium, scandium or a mixture thereof; B is aluminum or a mixture of aluminum and gallium or scandium. The dopant D is selected from cerium, praseodymium or mixtures thereof. The dopant is present in low concentrations with x is $0 < x \leq 0.15$, usually $0 < x \leq 0.07$ and often $0 < x \leq 0.04$. In particular, in the garnet A may be lutetium, B may be aluminum, and the dopant D may be cerium.

In an embodiment, the amount of barium (contained in the barium-containing oxide) with respect to the garnet material of the present invention may be up to 2.5 wt % (wt %=percent by weight), and particularly more than 0.01 wt %, for example from 0.04 wt % to 1.5 wt %.

In an embodiment, the barium-containing oxides of the garnet material are at least partially present as separate phases. Usually, at least 99 wt % of the total amount of barium is present in separate phases. These separate phases may be determined by wavelength dispersive X-ray analysis (WDXA) and optical methods, e.g. electron microprobe analysis (EMPA) or scanning electron microscopy (SEM). In an embodiment, at least 80% of the total area in the EMPA image of these separate phases have a diameter smaller than 3 μm, and at least 95% have a diameter smaller than 5 μm as determined form the EMPA analysis. These separate phases may consist of or comprise a barium aluminum oxide of the formula $Ba_xAl_{2y}O_{x+3y}$ (wherein x and y are integers>0), for instance barium aluminate ($BaAl_2O_4$) and/or barium hexaluminate ($BaAl_{12}O_{19}$ or $BaO*6Al_2O_3$).

In a further embodiment, the garnet material can comprise one or more metal species in low concentrations of less than 1 wt % each. In particular, the metal species may be calcium, magnesium, strontium, boron, silicon, zirconium, additional aluminum and scandium. Usually, the one or more metal species are metal oxides. These metal species may be present, for instance when a preformed garnet powder is used which contains the metal species as unintended impurities (all unintended impurities usually adding up to an amount of 2 wt % at the most) or when they are deliberately added as sintering aids. These metal species may or may not be part of additional separate phases.

In a further embodiment, the garnet material has an average grain size of 5 to 50 μm and particularly 10 to 20 μm determined by image analysis.

According to an embodiment, the pores of the garnet material are annihilated to a major extent. A low porosity is an important criterion for high transparency of a ceramic material, as light is scattered by the pores. The garnet material according to the present invention usually shows a porosity of 0.001 to 2 vol % (vol %=percent by volume), often of 0.001 to 1 vol % and particularly 0.001 to 0.1 vol %, of the entire volume of the garnet material. Further, the garnet material usually has a porosity of less than 1000000 pores per $cm^3$, often less than 1000 pores per $cm^3$, and it may have less than 100 pores per $cm^3$. Round closed cavities in the material with a diameter of 0.1 to 2 μm are counted as pores.

A ceramic material is an inorganic, non-metallic solid that has a crystalline, polycrystalline or partly crystalline structure and is prepared by the action of heat and subsequent cooling.

In a further embodiment, the garnet material is highly transparent. The transparency is defined by the total forward transmittance measured on a spectrometer by placing a disk sample in the port of an integrated sphere. The total forward transmission in the infrared at a wavelength of 2000 nm, away from wavelength at which for example excitation and absorption in the garnet material occur, provides good indicators for the transparency of the material. The garnet material has usually a total forward transmittance at 2000 nm of at least 66% and in particular, of more than 71%. The total forward transmittance may be higher than 75%, e.g. 79% which is close to the theoretical total forward transmittance of single crystals, for example of LuAG:Ce (approximately 80%). It is desirable to achieve a transparency as high as possible for applications in optoelectronic components. The total forward transmittance at a wavelength of 600 nm is higher than 51%, usually higher than 55%, and it may be higher than 60%.

According to an embodiment, the garnet material can convert light of a short wavelength, usually 400 to 490 nm, for example with a maximum of 420 to 470 nm. The converted light then usually shows wavelengths of 460 to 700 nm, for example a maximum of 500 to 580 nm, particularly between 510 to 560 nm. The garnet material is therefore suitable for an application as a green converter in optoelectronic components that can comprise for instance a blue LED light source. The emitted converted light and the transmitted blue light correspond to a green that can have a $C_x$ value of 0.28 to 0.42, for example 0.29 to 0.38, and a $C_y$ value of 0.44 to 0.060, for example 0.46 to 0.55, in the CIE chromaticity diagram.

As outlined above, the garnet material according to the invention may be an excellent green converter and allows efficient conversion of light, e.g. blue light with a short wavelength into green. The luminous efficacy, that is, measured lm with a converter chip of the garnet material in the beam path of the light source divided by the measured W of a blue light source, for example with a dominant wavelength of 440 nm, to air without converter chip, is high. The luminous efficacy of the garnet material is presenting higher than the one of regular green light generated by an indium-gallium nitride (InGaN) light source. A luminous efficacy of better than 290 lm/W and often better than 295 lm/W to air may be observed.

As a further aspect of the present invention, the use of a sintering aid is disclosed. The garnet materials according to all embodiments described above can be manufactured using barium-containing oxides or precursors of barium-containing oxides as a sintering aid. The barium-containing oxide may for example be barium aluminate. Other barium-containing oxides, e.g. barium oxide, barium hexaluminate or the respective precursors are also possible.

Precursors of barium-containing oxides are compounds that can directly or indirectly form a barium-containing oxide when heated. Decomposition products can be formed during the process for manufacturing, e.g. in the sintering or calcination step, if precursors are used.

For instance barium carbonate, but also barium-containing hydroxides, sulphates, nitroxides etc. with or without water of crystallization can directly form a barium-containing oxide in the heat. In these cases, gaseous decomposition products are often formed, e.g. carbon dioxide if barium carbonate is used.

Barium-containing oxides such as barium aluminate, barium hexaluminate or barium oxide do not form decomposition products when they are heated during the process of manufacturing. Therefore, impurities of decomposition products which may reduce the transparency of the garnet material are avoided. For instance, when a volatile compound is formed by decomposition of a precursor, the volatile compound might be trapped during sintering and form pores.

As precursors, other barium salts that do not directly form barium-containing oxides when heated may be used as well. The formed intermediate has to be converted with another reagent in a volatile compound upon simultaneous formation of the barium-containing oxide during the process or in a separate process step. For example, when barium fluoride is used, boron derivatives are required to remove the fluoride impurities. However, due to the additional reagent required for these precursors, the sintering process is more difficult.

It was observed with a barium-containing oxide as a sintering aid that a highly dense, transparent garnet material was obtained using for manufacturing for example a preformed LuAG:Ce powder even having an increased average particle size. Usually, it is impossible to sinter coarse particles to transparent polycrystalline garnet material; a particle size of smaller than 0.5 μm is normally required. However, upon using the barium-containing oxide as sintering aid according to the present invention, a transparent polycrystalline garnet material was also obtained with particles of preformed garnet material that are larger than 1 μm and even larger than 3 μm. This demonstrates the potential of barium-containing oxides as sintering aids.

It was observed, using a barium-containing oxide as sintering aid that the barium was barely scavenged in the garnet structure. Compared to the metal of other sintering aids that are commonly used for the manufacturing of YAG or LuAG such as $CaO$, $SiO_2$, $MgO$, $ZrO_2$, $Al_2O_3$, $Sc_2O_3$ or combinations thereof, barium is less soluble in the garnet structure making barium-containing oxides more potent sintering aids than the ones known from literature. The barium-containing oxide is effective in low concentrations providing highly dense, transparent garnet material with thoroughly annihilated pores. An explanation may be the large ionic radius of the barium cation ($Ba^{+2}$).

Furthermore, barium-containing oxides possess usually a relatively low vapor pressure and are, therefore, effective in low concentrations. Thus, barium-containing oxides are expected to be superior sintering aids compared to other metal salts, wherein the metal has a large cation, e.g. strontium, tin and lead. In particular, tin and lead have much higher vapor pressures than barium at a given temperature. Strontium is supposedly better soluble in the structure of the garnet material, and it has a higher vapor pressure than barium at a given temperature.

Beside barium oxides alone, also a combination of a barium-containing oxide with another metal oxide may be used. In particular, an excess of aluminum oxide, i.e. an amount of aluminum oxide that is not required for the stoichiometry of the garnet structure, but also the oxides of calcium, magnesium, strontium, silicon, zirconium, and scandium or mixtures thereof are useful sintering aids in the combination with a barium-containing oxide.

When barium aluminate is used as a sintering aid to form garnet material, the grain-growth was effectively controlled. An uncontrolled or an exaggerated grain growth as obtained with sintering aids according to the prior art results in opaque garnet material, because pores can be trapped inside the large grains. As barium oxides, for example barium aluminate, are very powerful sintering aids, they allow the manufacturing of transparent garnet material, e.g. LuAG:Ce, at comparably low sintering temperatures, for example 50° C. to 100° C. under the commonly used temperatures, e.g. 1850° C. In general, low sintering temperatures result in decreased concentrations of point defects such as oxygen vacancies providing higher transparency of the garnet material.

As a further aspect of the present invention, a method for manufacturing the garnet materials according to the present invention is disclosed. The method comprises the following steps:

A slurry is formed from a starting material comprising a starting material for the garnet, a sintering aid, in particular the barium-containing oxide, one or more organic binders and water.

Then, a green body is formed from the slurry.

The green body is prefired.

Sintering of the material obtained in the prefiring step.

The starting material for the garnet can be the respective garnet powder itself or mixed metal oxides, that is, a mixture of different binary metal oxides. Precursors of metal oxides that are subsequently converted into metal oxides, or a combination of garnet powder and/or binary metal oxides and/or metal oxide precursors may also be used to manufacture the garnet material according to the invention. The metal oxides are usually available in appropriate quality having average particle sizes smaller than 0.5 μm, e.g. 0.3 μm.

The sintering aid can be a barium-containing oxide, e.g. barium aluminate, a precursor of a barium-containing oxide or a combination of a barium-containing oxide or its precursor with another metal oxide.

To form the slurry, the compounds are thoroughly mixed. For example, a ball mill may be used to mix the solid compounds, and then, the one or more organic binders and water are added.

To form the green body, the slurry can for example be gel-casted into a predetermined shape or casted to a tape which may then be formed into chips. In principle, any other shape can be formed too.

Alternatively, a flowable powder may be made with a soft agglomeration of the starting material for the garnet and the sintering aid with organic binders and/or water which is formed by dry pressing into a green body.

The green body is prefired at 800° C. to 1400° C. for example in air giving a compact. Usually, the temperature for the prefiring step is 1050° C. to 1250° C., e.g. 1150° C. During the prefiring, the organic binders and water are removed, and the compact gains some mechanical stability. If precursors of the barium-containing oxides or of the metal oxides are used, the decomposition of these precursors usually occurs in the prefiring step.

The compact, i.e. the material obtained in the prefiring step, is sintered at 1650° C. to 1900° C. for up to 20 h giving the garnet material. Usually, the temperature for the sintering step is 1700° C. to 1800° C., e.g. at 1750° C., for 4 to 20 h. The sintering step can be carried out without pressure. Often, a reducing environment is used for the sintering, for example wet hydrogen. Other environments, for example neutral gases such as nitrogen or argon, forming gas, i.e. a mixture of at least one neutral gas with hydrogen, or vacuum which may have some carbon pressure, may also be used.

Finally, as a further aspect of the present invention an optoelectronic component is disclosed comprising a garnet material according to at least one embodiment of the present invention. Therefore, all features that are disclosed for the garnet material are also disclosed for the optoelectronic component. In the optoelectronic component, a primary radiation of a first wavelength is a least partially converted by the garnet material in a secondary radiation of a second wavelength being longer than the first wavelength.

In an embodiment, the optoelectronic component may be a light-emitting diode, LED. It comprises a base housing, e.g. of plastic or ceramic, and usually a recess located in the housing. At least one light source, preferably a light-emitting semiconductor chip such as a LED which may have one or more active layers that can include inorganic and/or organic and/or polymeric material is applied. The light source may be a blue light-emitting diode (i.e. the first wavelength may be from 400 to 490 nm). The light source can comprise transparent conductive materials such as indium-tin oxide (ITO), particularly as electrodes. The light source may be applied on the bottom of the recess and is electrically interconnected. The base housing may be penetrated with the electric interconnection. The walls of the recess including the bottom can comprise a reflective material to form a reflector. The recess may be filled with a casting compound that may form a lens. The casting compound can be a transparent resin, e.g. epoxy or acrylate resin, silicone, a ceramic, a glass or an organic-inorganic hybrid material, particularly with a softening point under 300° C. The casting compound may comprise further additives, for example used to modify the light scattering. For example, a casting compound of silicone can contain $TiO_2$ particles.

In an embodiment, the optoelectronic component comprises a casting compound containing particles that comprise or consist of a garnet material according to the invention as a phosphor. The garnet material particles can be distributed evenly in the casting compound. Other distributions of the particles may be useful as well. The average size of the garnet material particles size may be smaller than 50 μm, e.g. 5 to 20 μm.

In another embodiment, garnet material according to the present invention may be present in a converter chip or in a converter platelet. The converter chip may consist of the garnet material or comprise the garnet material and other materials, for example providing mechanical stability to the chip. The chip may have any shape. The converter chip is applied in the beam path of the light source. It can be applied directly on the light source.

In the two embodiments described before, one or more additional phosphor materials of any shape may be present as well. For example, when the secondary wavelength that is emitted by the garnet material is in the green region of the visible spectrum, an additional red phosphor such as a europium-doped phosphor, e.g. $Sr_2Si_5N_8$:Eu, $(Sr,Ba)_2Si_5N_8$:Eu, $Ca_2Si_8Al_4N_{16}$:Eu, $CaAlSiN_3$:Eu, $SrSiO_4$:Eu, may be used. The optoelectronic component according to the present invention may be used to produce white light.

BRIEF DESCRIPTION OF THE DRAWINGS

The invention is described in more detail below with reference to a number of examples and exemplary embodiments in conjunction with the FIGS. 1 to 6. Elements of the same design and function that appear in different illustrations are identified by the same reference character.

DETAILED DESCRIPTION OF THE DRAWINGS

Figure 1:
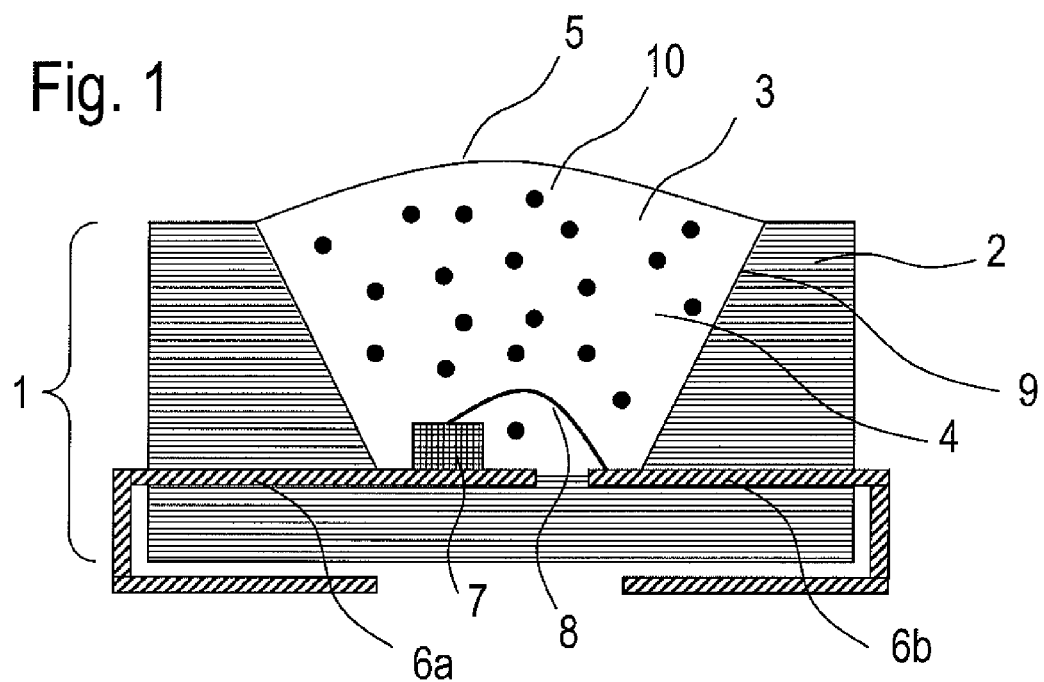
FIG. 1 shows a cross sectional view of an optoelectronic component according to an embodiment of the invention.

FIG. 1 shows a cross-sectional view of an optoelectronic component 1 according to an embodiment of the present invention. A base housing 2 may have a recess 3 in which a light-emitting semiconductor chip 7 is applied at the bottom of the recess 3. The semiconductor chip 7 may be a light-emitting diode with one or more active layers and is electronically interconnected by an electronic connector 6a and via a wire bonding 8 on top of the light-emitting semiconductor chip with an electronic connector 6b. The electronic connectors 6a and 6b are led outside the housing 2. The bottom and the side walls 9 comprise reflective material, thus forming a reflector. The recess 3 of the optoelectronic component 1 is filled with a casting compound 4 that is forming in this embodiment a lens 5. Particles of the garnet material 10 are distributed in the casting compound 4. Thus, the garnet material particles 10 can convert at least partially the light generated by the light-emitting semiconductor chip 7.

Figure 2:
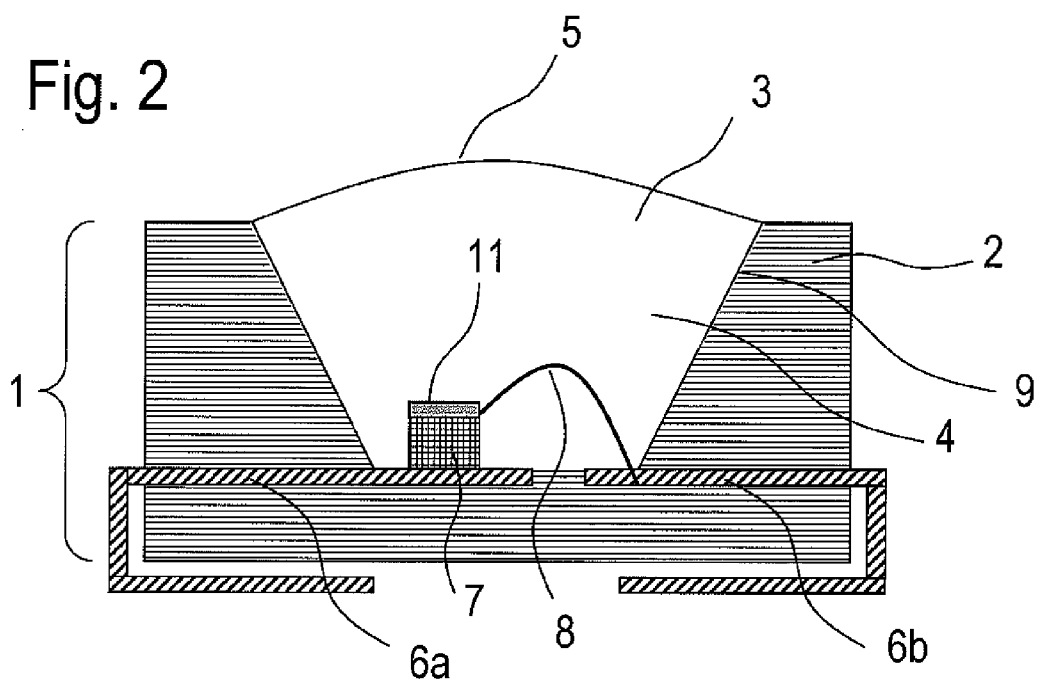
FIG. 2 shows a cross sectional view of an optoelectronic component according to a further embodiment of the invention.

FIG. 2 shows a cross-sectional view of an optoelectronic component 1 in accordance with a second embodiment of the invention. The base housing 2 having a recess 3 with side walls 9 and a light-emitting semiconductor chip 7, electronic connectors 6a and 6b, and wire bonding 8 are similar to the optoelectronic component described above. A casting compound 4 filling the recess 3 forms a lens 5. A converter chip 11 comprising a garnet material according to the present invention is applied in the beam path of the light-emitting semiconductor chip 7. In this case, it is applied directly on semiconductor chip 7, but other arrangements can also be useful. Therefore, the light generated by the semiconductor chip 7 is at least partially converted by the garnet material in the converter chip 11.

Figure 3:
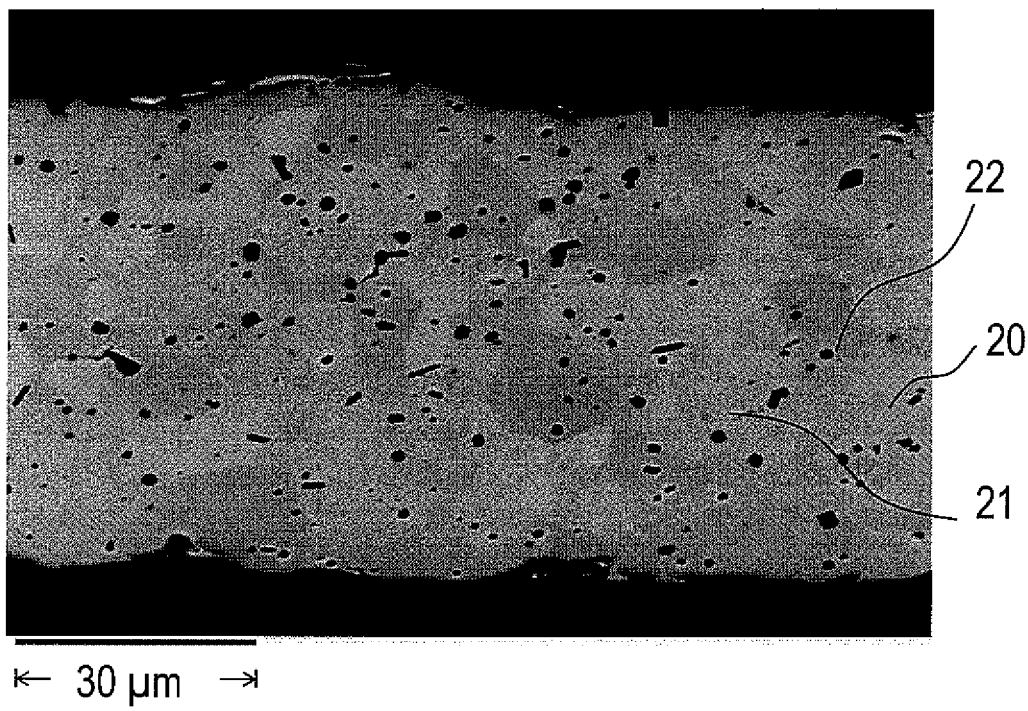
FIG. 3 shows an EMPA back-scattered electron image of a polished section of a LuAG:Ce ceramic material.

In FIG. 3, an electron microprobe analysis (EMPA) backscattered electron image of a polished section of a chip of a sintered LuAG:Ce ceramic material having 1 mol % of lutetium replaced by cerium, i.e. $(Lu_{0.99}Ce_{0.01})_3Al_5O_{12}$, according to the present invention is shown. The bright sections consist of two different phases of LuAG:Ce 20, 21. The dark grains 22 are separate phases of a barium-containing oxide. Over 95% (with respect to the whole barium-containing oxide area) of these barium-containing oxide phases have a diameter smaller than 5 μm. Over 80% have diameter smaller than 3 μm.

Figure 4:
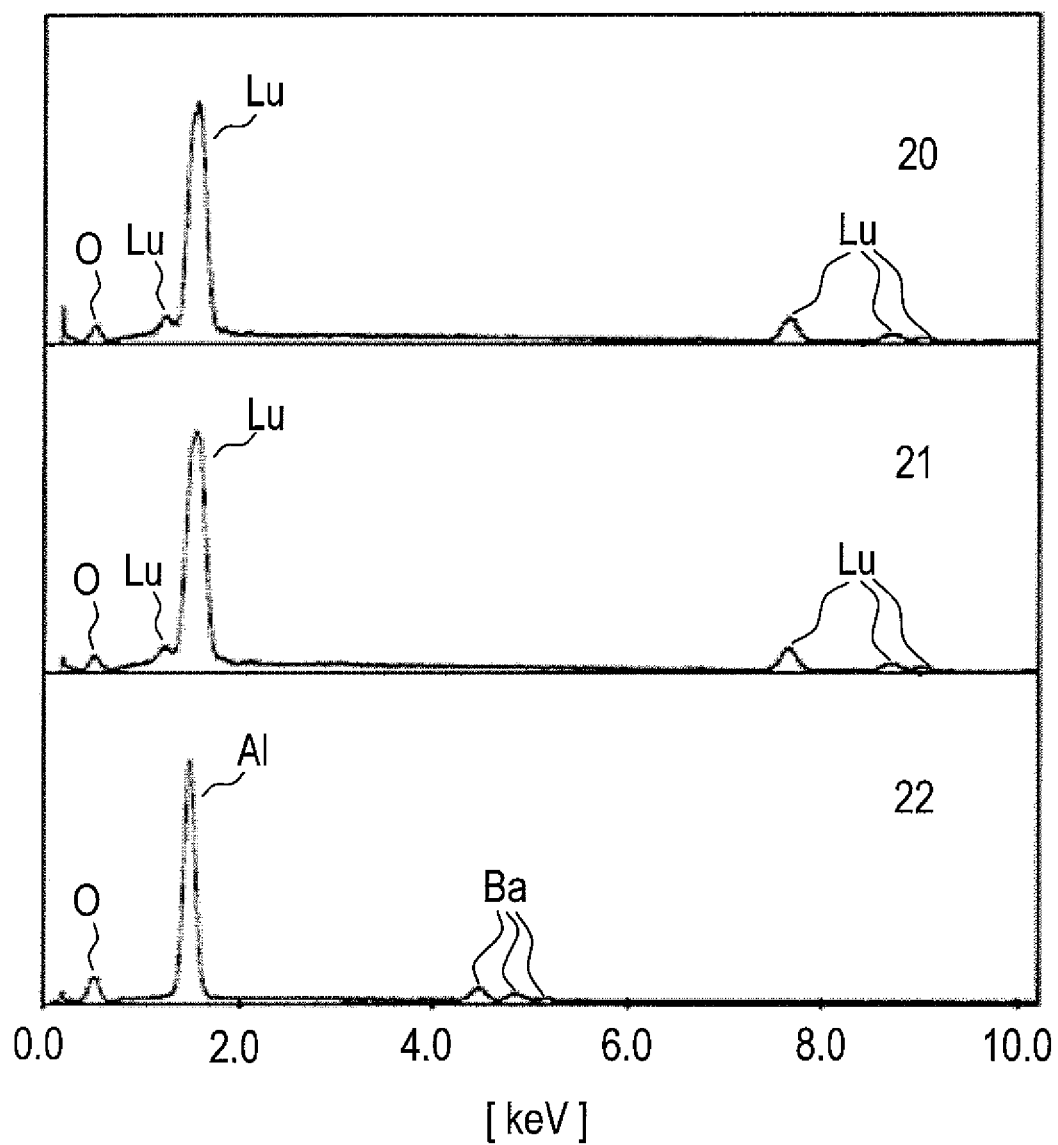
FIG. 4 shows the analysis by WDXA of phases in the LuAG:Ce material of FIG. 3.

The analysis of the different phases in the EMPA image by WDXA is shown in FIG. 4. The upper spectrum shows a phase of LuAG:Ce material 20, and the middle spectrum shows another phase of LuAG:Ce material 21. These phases 20, 21 are polycrystalline LuAG:Ce ceramic materials. The lower spectrum shows the analysis of a dark grain 22. It is a separate phase of a barium-aluminum oxide, e.g. barium aluminate. The dark grains 22 do not contain any LuAG:Ce material.

Figure 5:
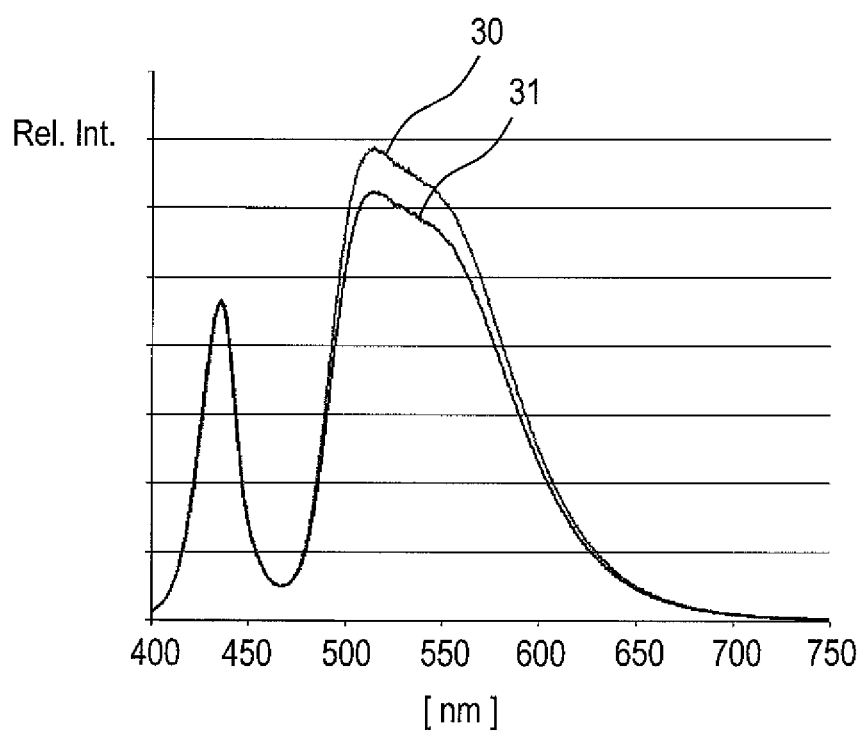
FIG. 5 shows an emission spectrum of a LuAG:Ce material according to the invention compared with a conventional sample of LuAG:Ce material.

FIG. 5 shows an emission spectrum (Rel. Int.=relative intensity as y-axis) of a blue light LED with a converter chip of a LuAG:Ce ceramic material having 0.5 mol % of lutetium replaced by cerium according to the present invention 30 compared with a converter chip of a conventional LuAG:Ce material 31 with 0.5 mol % of lutetium replaced by cerium prepared according to a prior art procedure. A primary radiation with a first wavelength of 440 nm is converted into a secondary radiation with a second wavelength having a maximum between 500 to 580 nm.

Figure 6:
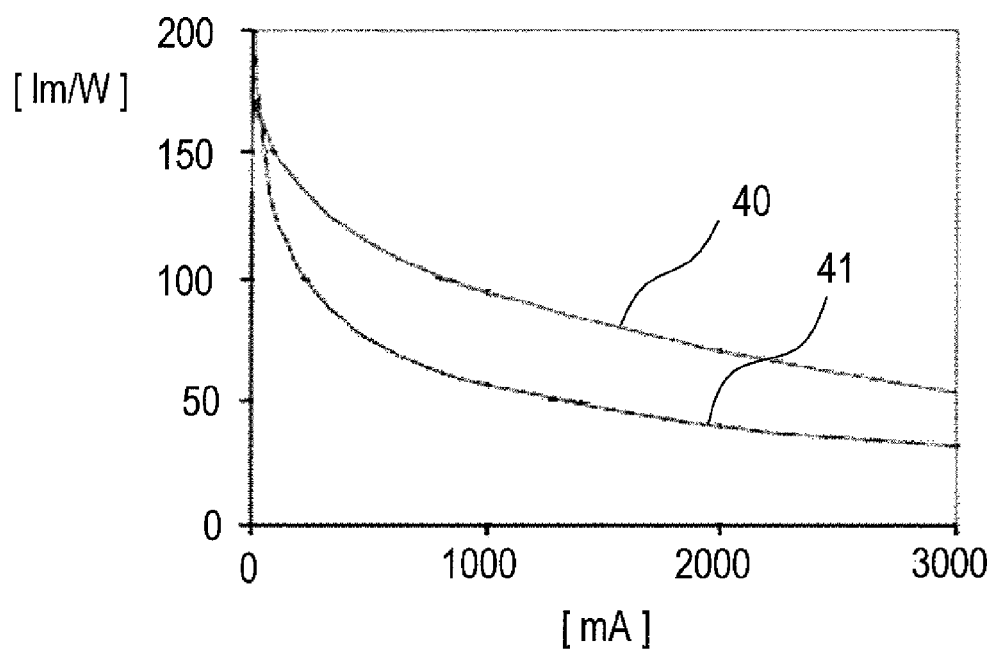
FIG. 6 shows the efficacy of full conversion green light with LuAG:Ce obtained according to the invention compared with InGaN green.

In FIG. 6, the efficacy (in lm/W) of a fully converted green by a LuAG:Ce material of the present invention 40 is compared with the "regular" green generated by InGaN 41. It shows, that converting the light into green by means of the garnet obtained according to the present invention is significantly more efficient.

EXAMPLES

According to the method for manufacturing garnet materials as it is outlined above, the use of barium-containing oxides as sintering aids is studied. Binary metal oxides are used as starting material, because they are readily available in appropriate quality, e.g. 99.7% pure and with small particle sizes of e.g. 0.3 μm. Preformed garnet material powders, e.g. LuAG:Ce powders, may be used alternatively but often contain a higher content of impurities. The synthesis of high-purity, finely dividedly LuAG powders, however, is laborious and cost-intensive. One or more of the starting materials may contain a small amount of yttrium. Therefore, the obtained LuAG:Ce material may also contain a small amount of yttrium, e.g. less than 0.5 wt %.

Barium aluminate is readily available in appropriate quality, e.g. 99.7% pure and with an average particle size of e.g. 0.3 μm. Further, barium aluminate is a stable barium-containing oxide, whereas barium oxide by itself may react with water or carbon dioxide from the ambient air. The barium aluminate is used in low concentrations, usually between 0.01 and 2.5 wt %, and often between 0.4 and 1.5 wt %. It may be combined with another metal salt for sintering, e.g. an excess of aluminum oxide.

Example 1

A mixture of 2.985 moles $Lu_2O_3$, 5 moles $Al_2O_3$, 0.03 moles $CeO_2$ and 0.56 wt % $BaAl_2O_4$ (with respect to 2 moles $(Lu,Ce)_3Al_5O_{12}$) was thoroughly mixed in a ball mill before forming the slurry. Then, organic binders, e.g. a water-based acrylic binder, and water were added to form a slurry. A tape was casted from the slurry and subsequently formed into chips which were prefired at 1150° C. in air and then sintered under wet hydrogen without pressure at 1750° C. to a highly transparent LuAG:Ce ceramic material.

The formed chip has a size of 1 mm*1 mm and a thickness of 120 μm. The material is almost fully dense with a density of 6.67 g/cm$^3$, and it is highly transparent. It has a total forward transmittance of 78.6% at a wavelength of 2000 nm and of 64.7% at 600 nm. The generated color, converted light and transmitted light, has a $C_x$ value of 0.2942 and a $C_y$ value of 0.4487 in the CIE chromaticity diagram.

Example 2

A mixture of 2.985 moles $Lu_2O_3$, 5 moles $Al_2O_3$, 0.03 moles $CeO_2$ and 0.09 wt % $BaAl_2O_4$ (with respect to 2 moles $(Lu,Ce)_3Al_5O_{12}$) was thoroughly mixed in a ball mill before forming the slurry. Then, organic binders, e.g. a water-based acrylic binder, and water were added to form a slurry. A tape was casted from the slurry and subsequently formed into chips which were prefired at 1150° C. in air and then sintered under wet hydrogen without pressure at 1750° C. to a highly transparent LuAG:Ce ceramic material.

The formed chip has a size of 1 mm*1 mm and a thickness of 120 μm. The material is almost fully dense with a density of 6.67 g/cm$^3$, and it is highly transparent. It has a total forward transmittance of 71.8% at a wavelength of 2000 nm and of 58.1% at 600 nm. The generated color, converted light and transmitted light, has a $C_x$ value of 0.3029 and a $C_y$ value of 0.4751 in the CIE chromaticity diagram. The measured luminous efficacy is 302 lm/W to air.

Example 3

A mixture of 2.955 moles $Lu_2O_3$, 5 moles $Al_2O_3$, 0.09 moles $CeO_2$ and 0.09 wt % $BaAl_2O_4$ (with respect to 2 moles $(Lu,Ce)_3Al_5O_{12}$) was thoroughly mixed in a ball mill before forming the slurry. Then, organic binders, e.g. a water-based acrylic binder, and water were added to form a slurry. A tape was casted from the slurry and subsequently formed into chips which were prefired at 1150° C. in air and then sintered under wet hydrogen without pressure at 1750° C. to a highly transparent LuAG:Ce ceramic material.

The formed chip has a size of 1 mm*1 mm and a thickness of 90 μm. The material is almost fully dense with a density of 6.67 g/cm$^3$, and it is highly transparent. It has a total forward transmittance of 75.3% at a wavelength of 2000 nm and of 66.6% at 600 nm. The generated color, converted light and transmitted light, has a C$_x$ value of 0.3430 and a C$_y$ value of 0.4998 in the CIE chromaticity diagram. The measured luminous efficacy is 296 lm/W to air.

Example 4

A mixture of 2.985 moles Lu$_2$O$_3$, 5 moles Al$_2$O$_3$, 0.03 moles CeO$_2$ and 2.0 wt % BaAl$_2$O$_4$ (with respect to 2 moles (Lu,Ce)$_3$Al$_5$O$_{12}$) was thoroughly mixed in a ball mill before forming the slurry. Then, organic binders, e.g. a water-based acrylic binder, and water were added to form a slurry. A tape was casted from the slurry and subsequently formed into chips which were prefired at 1150° C. in air and then sintered under wet hydrogen without pressure at 1750° C. to a highly transparent LuAG:Ce ceramic material.

The formed chip has a size of 1 mm*1 mm and a thickness of 130 μm. The material is almost fully dense with a density of 6.67 g/cm$^3$, and it is highly transparent. It has a total forward transmittance of 76.8% at a wavelength of 2000 nm and of 57.2% at 600 nm. The measured luminous efficacy is 300 lm/W to air.

Examples 5 to 6

The samples ware prepared according to the procedure of example 4.

Example 7

A mixture of 2.985 moles Lu$_2$O$_3$, 5 moles Al$_2$O$_3$, 0.03 moles CeO$_2$, 0.15 wt % BaAl$_2$O$_4$ (with respect to 2 moles (Lu,Ce)$_3$Al$_5$O$_{12}$) and 0.75 wt % Al$_2$O$_3$ (with respect to 2 moles (Lu,Ce)$_3$Al$_5$O$_{12}$) was thoroughly mixed in a ball mill before forming the slurry. A combination of barium aluminate and an excess of aluminum oxide were used as sintering aid in this example. Then, organic binders, e.g. a water-based acrylic binder, and water were added to form a slurry. A tape was casted from the slurry and subsequently formed into chips which were prefired at 1150° C. in air and then sintered under wet hydrogen without pressure at 1750° C. to a highly transparent LuAG:Ce ceramic material.

The formed chip has a size of 1 mm*1 mm and a thickness of 130 μm. The material is almost fully dense with a density of 6.67 g/cm$^3$, and it is highly transparent. It has a total forward transmittance of 71.0% at a wavelength of 2000 nm and of 55.9% at 600 nm. The generated color, converted light and transmitted light, has a C$_x$ value of 0.3046 and a C$_y$ value of 0.4873 in the CIE chromaticity diagram. The measured luminous efficacy is 305 lm/W to air.

Example 8

A mixture of 2.955 moles Lu$_2$O$_3$, 5 moles Al$_2$O$_3$, 0.09 moles CeO$_2$, 0.15 wt % BaAl$_2$O$_4$ (with respect to 2 moles (Lu,Ce)$_3$Al$_5$O$_{12}$) and 0.75 wt % Al$_2$O$_3$ (with respect to 2 moles (Lu,Ce)$_3$Al$_5$O$_{12}$) was thoroughly mixed in a ball mill before forming the slurry. Then, organic binders, e.g. a water-based acrylic binder, and water were added to form a slurry. A tape was casted from the slurry and subsequently formed into chips which were prefired at 1150° C. in air and then sintered under wet hydrogen without pressure at 1750° C. to a highly transparent LuAG:Ce ceramic material.

The formed chip has a size of 1 mm*1 mm and a thickness of 100 μm. The material is almost fully dense with a density of 6.67 g/cm$^3$, and it is highly transparent. It has a total forward transmittance of 66.3% at a wavelength of 2000 nm and of 51.5% at 600 nm. The generated color, converted light and transmitted light, has a C$_x$ value of 0.3708 and a C$_y$ value of 0.5344 in the CIE chromaticity diagram.

Example 9

A preformed LuAG:Ce powder with an average particle size of 3 μm having 1 mol % of lutetium replaced by cerium as a dopant and further containing 750 ppm barium, 5000 ppm yttrium, 110 ppm silicon, 58 ppm calcium, 53 ppm gadolinium, 35 ppm boron, 22 ppm zirconium and 17 ppm magnesium was thoroughly mixed in a ball mill before forming the slurry. Then, organic binders, e.g. a water-based acrylic binder, and water were added to form a slurry. A tape was casted from the slurry and subsequently formed into chips which were prefired at 1150° C. and then sintered under wet hydrogen without pressure at 1800° C. to a highly transparent LuAG:Ce ceramic material.

The formed chip has a size of 1 mm*1 mm and a thickness of 130 μm. The material is almost fully dense with a density of 6.67 g/cm$^3$, and it is transparent. It has a total forward transmittance of 31.9% at a wavelength of 2000 nm and of 31.7% at 600 nm.

Comparative Example 1

A mixture of 2.985 moles Lu$_2$O$_3$, 5 moles Al$_2$O$_3$ and 0.03 moles CeO$_2$ was thoroughly mixed in a ball mill before forming the slurry. Then, organic binders, e.g. a water-based acrylic binder, and water were added to form a slurry. A tape was casted from the slurry which was prefired at 1150° C. in air and then sintered under wet hydrogen without pressure at 1800° C. to a LuAG:Ce ceramic material.

The formed chip has a size of 1 mm*1 mm and a thickness of 130 μm. The material is almost fully dense with a density of 6.67 g/cm$^3$, and it is transparent. It has a total forward transmittance of 54.0% at a wavelength of 2000 nm and of 49.2% at 600 nm. The generated color, converted light and transmitted light, has a C$_x$ value of 0.3099 and a C$_y$ value of 0.5037 in the CIE chromaticity diagram. The measured luminous efficacy is 284 lm/W to air.

Comparative Examples 2 to 6

The sample was prepared according to the procedure of comparative example 1.

Comparative Example 7

A mixture of 2.985 moles Lu$_2$O$_3$, 5 moles Al$_2$O$_3$, 0.03 moles CeO$_2$ and 2.0 wt % Al$_2$O$_3$ (with respect to 2 moles (Lu,Ce)$_3$Al$_5$O$_{12}$) was thoroughly mixed in a ball mill before forming the slurry. Then, organic binders, e.g. a water-based acrylic binder, and water were added to form a slurry. A tape was casted from the slurry which was prefired at 1150° C. in air and then sintered under wet hydrogen without pressure at 1800° C. to a LuAG:Ce ceramic material.

The formed chip has a size of 1 mm*1 mm and a thickness of 150 μm. The material is almost fully dense with a density of 6.67 g/cm$^3$, and it is transparent. It has a total forward transmittance of 52.9% at a wavelength of 2000 nm and of 43.7% at 600 nm. The generated color, converted light and transmitted light, has a C$_x$ value of 0.3058 and a C$_y$ value of 0.4913 in the CIE chromaticity diagram.

Comparative Example 8

The sample was prepared according to the procedure of comparative example 7.

The examples are summarized in Table 1.

TABLE 1

| | Thickness of chip in μm | total forward transmission at 2000 nm in % | total forward transmission at 600 nm in % | Luminous efficacy to air in lm/W |
|---|---|---|---|---|
| Example 1 | 120 | 78.6 | 64.7 | |
| Example 2 | 120 | 71.8 | 58.1 | 302 |
| Example 3 | 90 | 75.3 | 66.6 | 296 |
| Example 4 | 130 | 76.8 | 57.2 | 300 |
| Example 5 | 130 | 68.5 | 57.4 | 298 |
| Example 6 | 130 | 69.0 | 56.3 | 298 |
| Example 7 | 130 | 71.0 | 55.9 | 305 |
| Example 8 | 100 | 66.3 | 51.5 | |
| Example 9 | 130 | 31.9 | 31.7 | |
| Comparative example 1 | 130 | 54.0 | 49.2 | 284 |
| Comparative example 2 | 140 | 41.9 | 30.7 | 273 |
| Comparative example 3 | 150 | 56.2 | 50.7 | |
| Comparative example 4 | 150 | 37.4 | 28.3 | |
| Comparative example 5 | 150 | 43.2 | 31.2 | 265 |
| Comparative example 6 | 150 | 46.6 | 36.7 | |
| Comparative example 7 | 150 | 52.9 | 43.7 | |
| Comparative example 8 | 160 | 62.7 | 52.0 | |

The invention is not limited to the embodiments described above. It rather comprises all new features and all combinations of features, which in particular includes all imaginable combinations of features in the claims, also when the respective feature or the respective combination itself is not explicitly stated in the claims or embodiments.

We claim:

1. A ceramic material, comprising a garnet having the composition represented by the formula $A_{3-x}B_5O_{12}:D_x$ and a barium-aluminum oxide of the formula $Ba_zAl_{2y}O_{z+3y}$, wherein in the garnet $A_{3-x}B_5O_{12}:D_x$:
   A is selected from lutetium, yttrium, gadolinium, terbium, scandium, another rare earth metal or mixtures thereof,
   B is selected from aluminum, scandium, gallium, indium, boron or mixtures thereof,
   D is at least one dopant selected from chromium, manganese and rare earth metals, and
   $0 \leq x \leq 2$,
   wherein in the barium aluminum oxide $Ba_zAl_{2y}O_{z+3y}$, z and y are integers >0, and wherein in the ceramic material, the amount of barium is 0.01 to 2.5 wt % and the garnet material shows a porosity of 0.001 to 0.1 vol % of the entire volume of the material, and
   wherein the barium aluminium oxide is present as separate phases different from the phase of the $A_{3-x}B_5O_{12}:D_x$ and wherein at least 99 wt % of the total amount of barium is present in the separate phases.

2. The ceramic material according to claim 1, wherein in the garnet $A_{3-x}B_5O_{12}:D_x$
   A is selected from lutetium, yttrium, gadolinium, terbium, scandium or a mixture thereof,
   B is selected from aluminum or a mixture of aluminum and gallium or scandium,
   D is selected from cerium, praseodymium or mixtures thereof, and
   x is $0 < x \leq 0.15$.

3. The ceramic material according to claim 1, wherein at least a part of the barium aluminum oxide forms a separate phase.

4. The ceramic material according to claim 1, wherein the material comprises an amount of at least one additional metal oxide, wherein the at least one additional metal oxide is selected from oxides of calcium, magnesium, strontium, boron, silicon, zirconium, aluminum, scandium or mixtures thereof.

5. The ceramic material according to claim 1, wherein the material is transparent, and the total forward transmittance at a wavelength of 2000 nm is at least 66%.

6. The ceramic material according to claim 1, wherein the material absorbs light with a wavelength of 400 to 490 nm, and wherein the material emits light with a wavelength of 460 to 700 nm.

7. The ceramic material according to claim 1, having a luminous efficacy of better than 290 lm/W.

8. A method of manufacturing the material according to claim 1, comprising the steps of:
   forming a slurry from a starting material comprising a sintering aid, an organic binder and starting material for the garnet, wherein the sintering aid comprises $BaAl_2O_4$ and/or $BaAl_{12}O_{19}$;
   forming a green body from the slurry;
   prefiring the green body; and
   sintering of the prefired green body.

9. The method according to claim 8, wherein the prefiring is performed at 800° C. to 1400° C., and wherein the sintering is performed at 1650° C. to 1900° C.

10. A radiation-emitting component comprising a converter chip or a converter plate formed from a green body tape which consists of a ceramic material, comprising a garnet having the composition represented by the formula $A_{3-x}B_5O_{12}:D_x$ and a barium aluminum oxide of the formula $Ba_zAl_{2y}O_{z+3y}$, wherein in the garnet $A_{3-x}B_5O_{12}:D_x$:
   A is selected from lutetium, yttrium, gadolinium, terbium, scandium, another rare earth metal or mixtures thereof,
   B is selected from aluminum, scandium, gallium, indium, boron, or mixtures thereof,
   D is at least one dopant selected from chromium, manganese, and rare earth metals, and $0 < x \leq 2$,
   wherein in the barium aluminum oxide $Ba_zAl_{2y}O_{z+3y}$, z and y are integers >0, and wherein in the ceramic material, the amount of barium is 0.01 to 2.5 wt % and the garnet material shows a porosity of 0.001 to 0.1 vol % of the entire volume of the ceramic material wherein the barium aluminium oxide is present as separate phases different from the phase of the $A_{3-x}B_5O_{12}:D_x$, at least 99 wt % of the total amount of barium is present in the separate phases, and the ceramic material converts at least partially a primary radiation of a first wavelength in a secondary radiation of a second wavelength that is longer than the first wavelength.

11. The radiation-emitting component according to claim 10, wherein the maximum of the primary radiation is between 420 to 470 nm, and wherein the maximum of the secondary radiation is between 500 to 580 nm.

12. The method according to claim 9, wherein the prefiring is performed at 1050° C. to 1250° C., and wherein the sintering is performed at 1700° C. to 1800° C.

13. The ceramic material according to claim 1, wherein D is at least one dopant selected from cerium, praseodymium or gadolinium.

14. The ceramic material according to claim 2, wherein x is 0<x≤0.07.

15. The ceramic material according to claim 1, wherein in the material the amount of barium is 0.04 to 1.5 wt %.

16. The ceramic material according to claim 3, wherein at least a part of the barium aluminum oxide forms a separate phase of $BaAl_2O_4$ or $BaAl_{12}O_{19}$.

17. The ceramic material according to claim 5, wherein the total forward transmittance at a wavelength of 2000 nm is at least 71%.

18. The ceramic material according to claim 17, wherein the total forward transmittance at a wavelength of 2000 nm is higher than 75%.

19. The ceramic material according to claim 6, wherein the material absorbs light with a wavelength maximum of 420 to 470 nm, and wherein the material emits light with a wavelength maximum of 500 to 580 nm.

20. The ceramic material according to claim 7, having a luminous efficacy higher than 295 lm/W.

21. The radiation-emitting component according to claim 10, wherein the converter chip has a size of 1 mm*1 mm.

22. The radiation-emitting component according to claim 21, wherein the converter chip has a thickness of 90 μm, 100 μm, 120 μm, or 130 μm.

23. A ceramic material, comprising a garnet having the composition represented by the formula $A_{3-x}B_5O_{12}:D_x$ and a barium-aluminum oxide of the formula $Ba_zAl_{2y}O_{z+3y}$, wherein in the garnet $A_{3-x}B_5O_{12}:D_x$:

A is selected from lutetium, yttrium, gadolinium, terbium, scandium, another rare earth metal or mixtures thereof, B is selected from aluminum, scandium, gallium, indium, boron or mixtures thereof, D is at least one dopant selected from chromium, manganese and rare earth metals, and $0 \leq x \leq 2$, in the barium aluminum oxide $Ba_zAl_{2y}O_{z+3y}$, z and y are integers >0, in the ceramic material, the amount of barium is 0.01 to 2.5 wt %, the garnet material shows a porosity of 0.001 to 1 vol % of the entire volume of the material, the barium aluminium oxide is present as separate phases different from the phase of the $A_{3-x}B_5O_{12}:D_x$ and at least 99 wt % of the total amount of barium is present in the separate phases, the grain size of the garnet is 10 to 20 μm, over 95% of the barium containing phases have a diameter smaller than 5 μm, and the ceramic material is transparent, and the total forward transmittance at a wavelength of 2000 nm is at least 66%.

* * * * *